United States Patent
Wang et al.

(10) Patent No.: US 7,304,846 B2
(45) Date of Patent: Dec. 4, 2007

(54) HEATSINK DEVICE OF VIDEO GRAPHICS ARRAY AND CHIPSET

(75) Inventors: Frank Wang, Taipei (TW); Jui-Chan Fan, Taipei (TW)

(73) Assignee: Inventec Corporation, Shih-Lin District, Taipei (TW)

( * ) Notice: Subject to any disclaimer, the term of this patent is extended or adjusted under 35 U.S.C. 154(b) by 303 days.

(21) Appl. No.: 11/057,335

(22) Filed: Feb. 11, 2005

(65) Prior Publication Data

US 2006/0181856 A1 Aug. 17, 2006

(51) Int. Cl.
*H05K 7/20* (2006.01)

(52) U.S. Cl. .................. 361/700; 361/704; 361/719; 174/15.2; 165/80.4; 165/104.21; 257/715

(58) Field of Classification Search .............. None
See application file for complete search history.

(56) References Cited

U.S. PATENT DOCUMENTS

| | | | |
|---|---|---|---|
| 5,930,115 A * | 7/1999 | Tracy et al. ............... 361/704 |
| 6,504,711 B2 * | 1/2003 | Wu et al. ................... 361/687 |
| 6,549,404 B1 * | 4/2003 | Kitahara et al. ............ 361/695 |
| 6,708,754 B2 * | 3/2004 | Wei .............................. 165/46 |
| 6,717,811 B2 * | 4/2004 | Lo et al. ..................... 361/698 |
| 6,883,594 B2 * | 4/2005 | Sarraf et al. ........... 165/104.33 |
| 6,937,474 B2 * | 8/2005 | Lee ............................. 361/715 |
| D509,806 S * | 9/2005 | Lee et al. .................. D13/179 |
| 7,019,974 B2 * | 3/2006 | Lee et al. ................... 361/700 |
| 7,209,356 B2 * | 4/2007 | Lee et al. ................... 361/719 |

* cited by examiner

*Primary Examiner*—Boris Chervinsky
(74) *Attorney, Agent, or Firm*—Morris Manning Martin LLP; Tim Tingkang Xia, Esq.

(57) ABSTRACT

Disclosed is a heatsink device of video graphics array (VGA) and chipset. The main characteristic is making an integrated design for heatsink devices. Using a heatsink plate stacks on VGA and chipset instead of several ones as before. The heatsink plate has more heat dissipation area than that of conventional heatsink. The device also integrates other heat generated elements stacking below the heatsink plate to dissipating more heat, so as to increase heat dissipation effect of the heatsink plate. The device makes the operation of VGA and chipset more effectively and increases their life-time.

9 Claims, 6 Drawing Sheets

HEATSINK DEVICE OF VIDEO GRAPHICS ARRAY AND CHIPSET

BACKGROUND OF THE INVENTION

1. Field of the Invention

The present invention relates to a heatsink device of video graphics array (VGA) and chipset, and in particular relates to a heatsink device of VGA and chipset to dissipate heat generated from computer, such as VGA and chipset, more effectively.

2. Description of the Related Art

Regarding to heatsink devices of computer elements, a heatsink device is commonly designed on each computer element, such as a central processing unit (CPU), video graphics array (VGA), or chipset. The conventional heatsink device not only occupies a lot of internal space of a computer case but also costs a lot. In addition, in a single computer element, the heat dissipation area of the heatsink device has a limitation, therefore, the heat dissipation on a computer element will also be affected. When the heat dissipation of the heatsink device is not functioning well, the computer elements may not operate properly. Running in such an environment may caused the elements damaged, hereby shortening the elements' life time.

Therefore, there is a need to provide a heatsink structure for dissipating heat generated from a VGA and chipset, when the VGA and chipset are in operation. To be effectively heat dissipating, the mentioned drawbacks need to be solved so as to increase the heat dissipation area and save space and cost.

SUMMARY OF THE INVENTION

In view of above prior art questions, the main purpose of this invention is to provide a heatsink device for dissipating heat generated from VGA and chipset simultaneously in order to solve a drawback of occupying too many space for traditional heatsink device in a computer element, to overcome the poor heat dissipation problem, and to provide a new heatsink for cost saving.

To fulfill the above-mentioned objects, this invention provides a heatsink device for VGA and chipset. The main characteristic is making an integrated design for heatsink devices. The new heatsink design relies on increasing heat dissipation area on a heatsink plate and put the heatsink plate on VGA and chipset. Also, it integrates other heat generated elements stacking below the heatsink plate to dissipate more heat, so as to increase heat dissipation effect of the heatsink plate.

For better knowledge and understanding of characteristics, purposes and functions of the disclosed invention, the detailed descriptions are as follows:

DETAILED DESCRIPTION OF THE INVENTION

The invention relates to a heatsink device used to dissipate heat generated by two thermal sources including a video graphics array (VGA) and a chipset. The main characteristic of the present invention is to integrate different heatsink devices into a heatsink plate stacked on the VGA and the chipset. The heatsink plate has more heat dissipation area than that of the conventional heatsink, and it also integrates other heat generated elements stacking below the heatsink plate to dissipate heat, so as to increase the heat dissipation rate of the heatsink plate. Therefore, the invented heatsink device, among other things, is of advantageous over the conventional heatsink devices that are set up on a CPU, VGA, and chipset individually, thus occupy more space, and have poor heat dissipation rates and higher cost.

For better knowledge and understanding of characteristics, purposes, and functions of the disclosed invention, the detailed descriptions are as follows.

Figure 1:
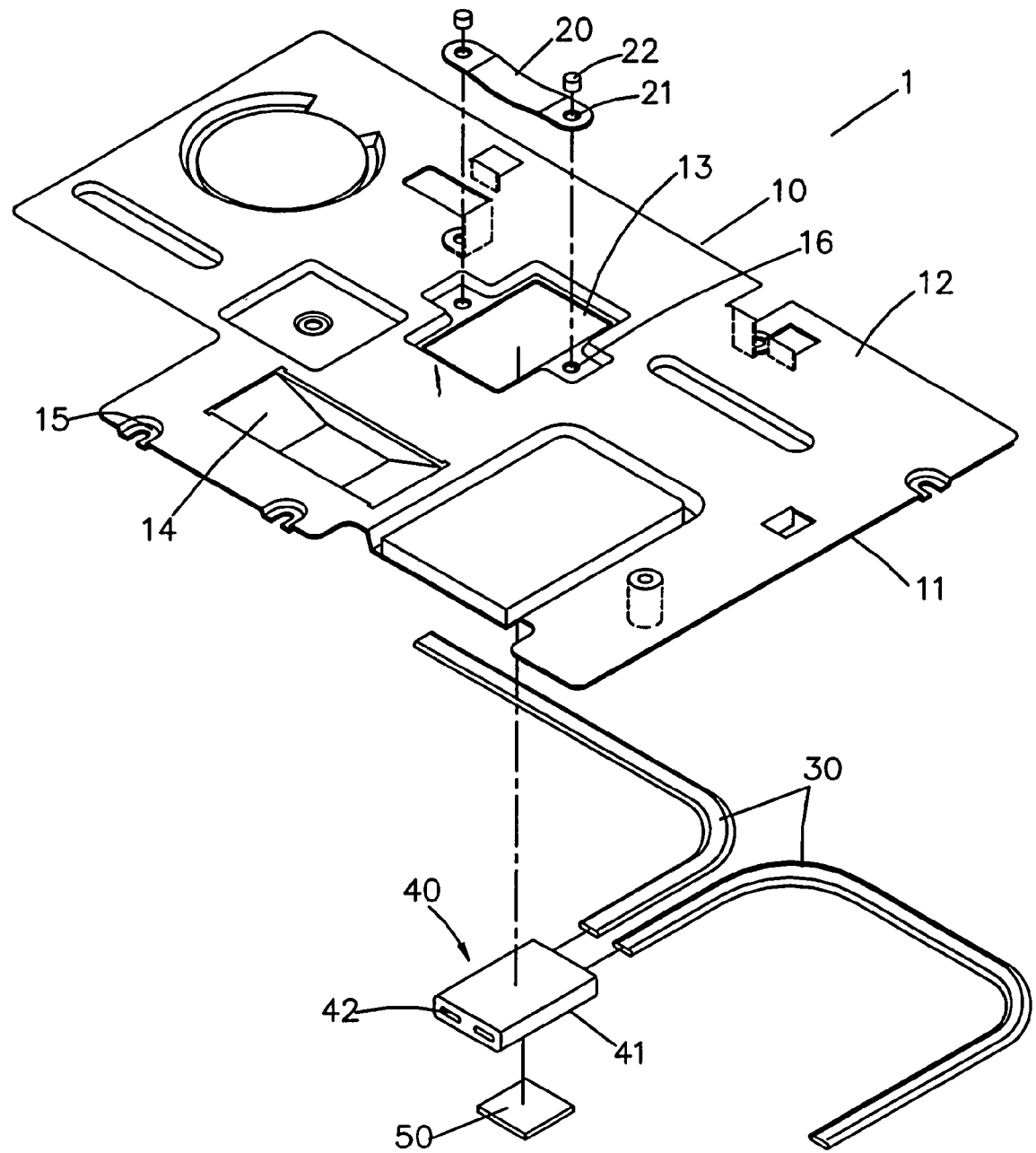
FIG. 1 is the schematic diagram of main elements of present invention.

As shown in FIG. 1, the present invention provides a heatsink device 1 adapted for dissipating heat of a VGA and a chipset. In one embodiment, the heatsink device 1 includes a heatsink plate 10, a floating leaf spring 20, two heat dissipation tubes 30, a sliding block 40, and a heat dissipating pad 50.

The heatsink plate 10 has a protruding shape. Its lower surface 11 defines a heatsink pedestal 13 adapted for contacting with a VGA and a chipset heatsink pedestal 14 adapted for contacting with a chipset heatsink flat-top. In addition, the floating leaf spring 20 is a floating spring. The floating leaf spring 20 defines at least two holes 21 for receiving at least two fixtures 22, which are used to secure the two heat dissipation tubes 30. The sliding block 40 is an angle rotatable and adjustable sliding block defining at least two through holes 42. The two through holes 42 are used for accommodating the two heat dissipation tubes 30. The two heat dissipation tubes 30 are formed internally with a fiber and heat conduction medium.

According to one embodiment of the present invention, the heatsink plate 10 of a heatsink device 1 is formed by a one-body method.

According to the present invention, the VGA heatsink pedestal 13 and the chipset heatsink pedestal 14 on the lower surface 11 of the heatsink plate 10 are formed by a stamping process. Firstly, a board is provided, and then the board is stamped as to make deformation by using a stamping module, which makes the board become a heatsink plate 10. The lower surface 11 of the heatsink plate 10 is also stamped at a predetermined position at the same time to form a flat-top for contacting with a VGA and a flat-top for contacting with a chipset. The flat-top for contacting with the VGA is a VGA heatsink pedestal 13 and the flat-top for contacting with the chipset is a chipset heatsink pedestal 14. By means of the stamping module, the edge portion of the heatsink plate 10 is formed with several edge holes 15 adapted for connecting with a motherboard. Further, the VGA heatsink pedestal 13 on the upper surface 12 of the heatsink plate 10 defines at least two holes 16 for connecting with the floating leaf spring 20.

Figure 3:
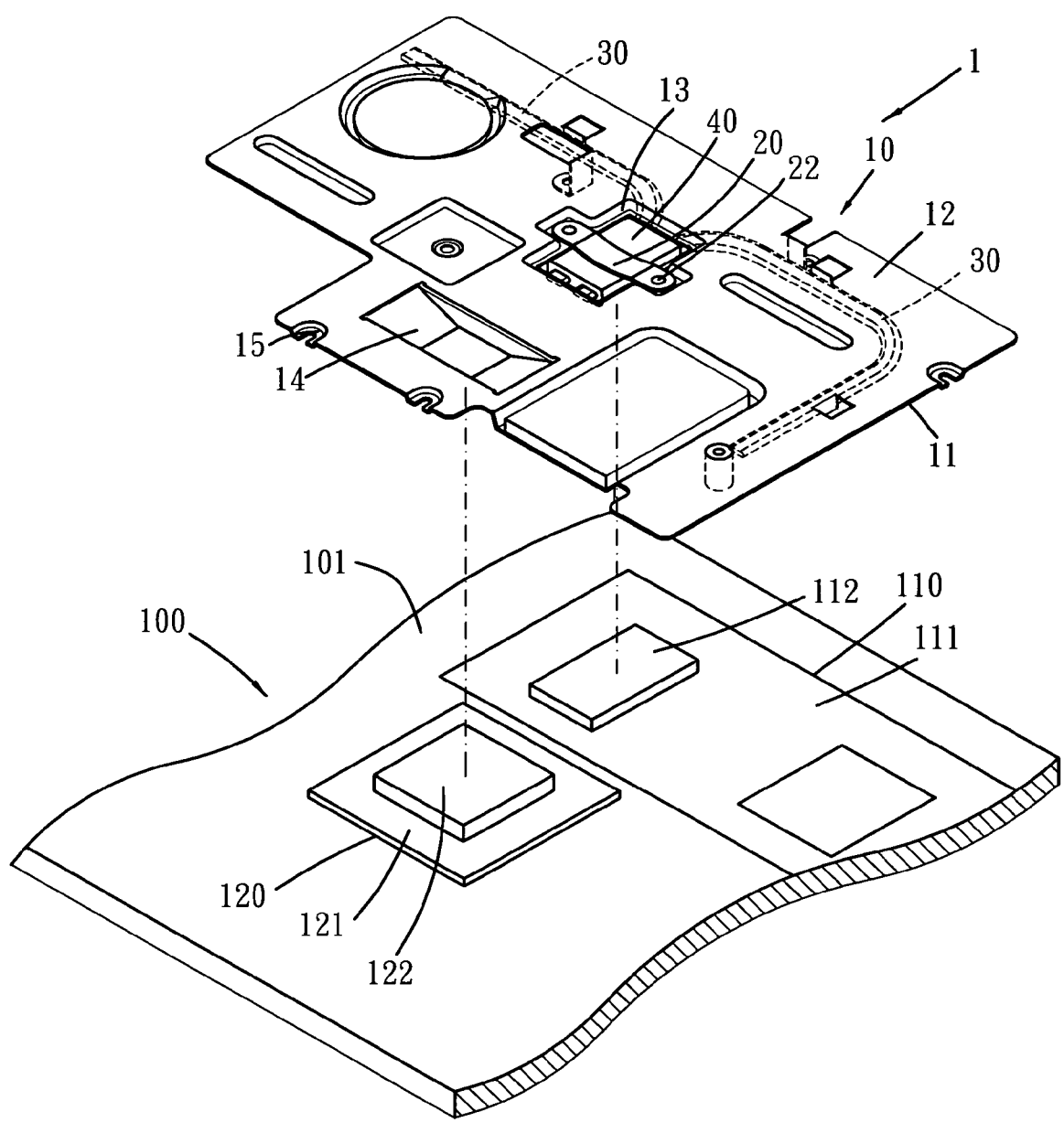
FIG. 3 is the 3D view of diagram showing a heatsink of the present invention stocking on a motherboard.

As shown in FIG. 3, a conventional motherboard 100 has an upper surface 101 for accommodating a VGA 110 and at least a chipset 120. The VGA 110 has a heatsink flat-top 112 and the chipset 120 has a heatsink flat-top 122.

Figure 2:
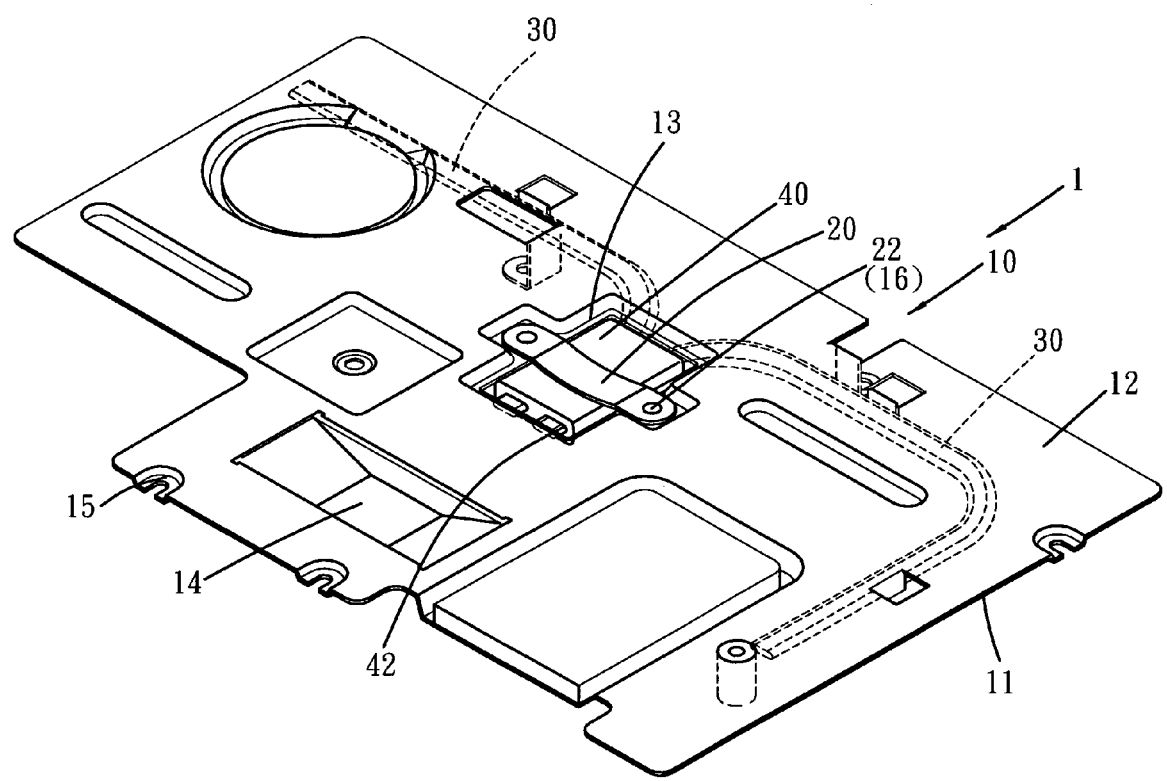
FIG. 2 is the 3D view of the present invention.
Figure 4:
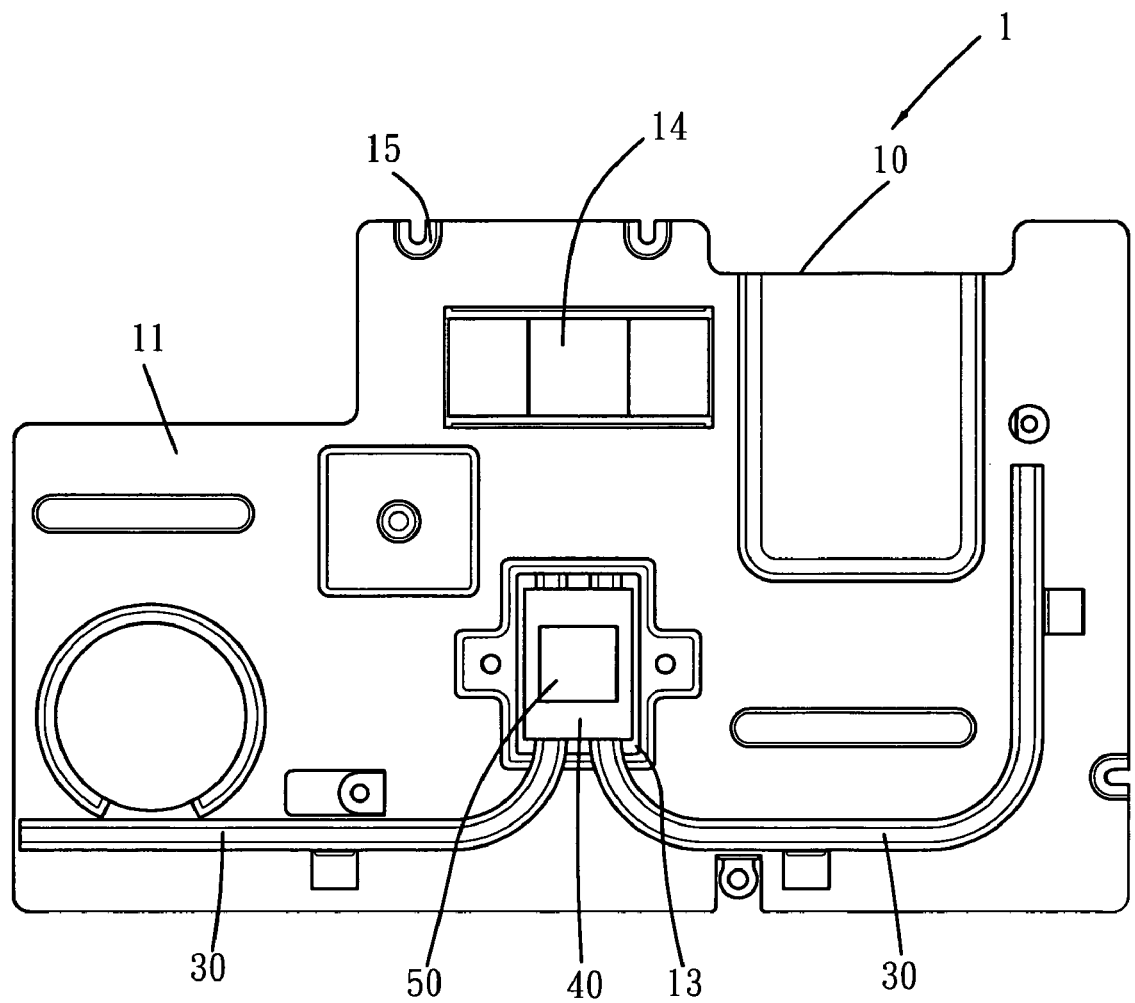
FIG. 4 is the bottom view of the present invention.

Referring back to FIG. 1, before the heatsink plate 10 is stacked and locked on the upper surface 101 of the motherboard 100, the heatsink dissipation pad 50 is stacked to the lower surface 41 of the sliding block 40 in advance. Then, the sliding block 40 is attached to the lower surface of the VGA heatsink pedestal 13 of the heatsink plate 10. As shown in FIGS. 2, 3, and 4, particularly in FIG. 4 which is a bottom view of the heatsink device 1 of the present invention, the sliding block 40 is positioned between the VGA heatsink pedestal 13 and the heatsink flat-top 112 of the VGA 110. Furthermore, the heatsink dissipation pad 50 is positioned between the sliding block 40 and the heatsink flat-top 112 of the VGA 110. After finished the above assembly, one places the two heat dissipation tubes 30 into the through holes 42 of the sliding block 40 and then fixes the heatsink plate 10 on the motherboard 100 by the way of the edge holes 15 of the heatsink plate 10. By rotating and adjusting the sliding block 40, the connecting tolerance of the heatsink plate 10 and the motherboard 110, or the height different of the heatsink plate 10 and the heatsink flat-top 112 of the VGA 110 can be adjusted, so that the sliding block 40 stacks on the heatsink flat-top 112 of the VGA 110 flatly to increase uniform heat dissipating.

Figure 5:
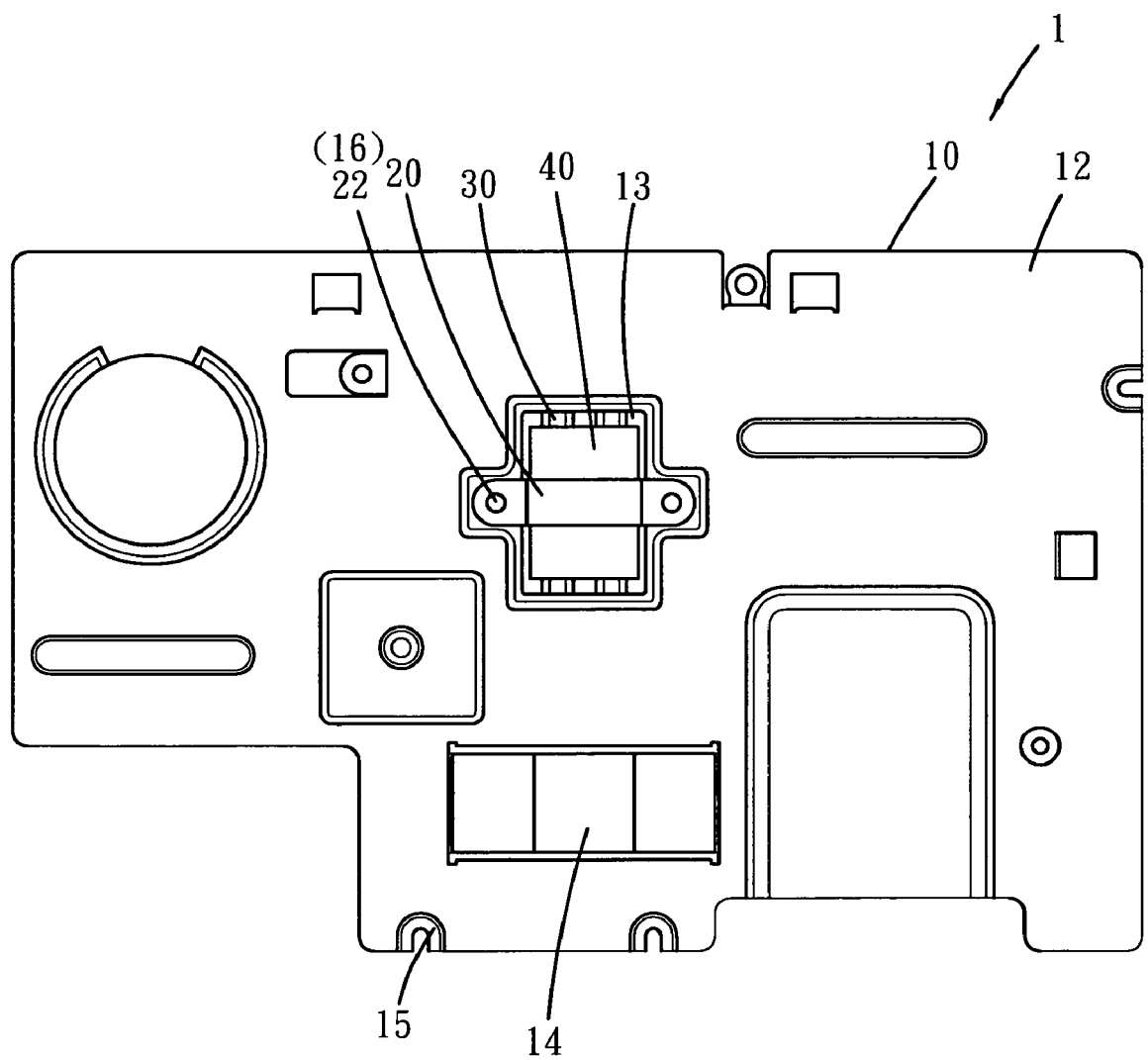
FIG. 5 is the top view of the present invention.

FIG. 5 is the top view of the heatsink device 1 of the present invention. After the heatsink plate 10 is attached to motherboard 100, the floating leaf spring 20 is then attached to the upper surface 12 of the heatsink plate 10. Then the floating leaf spring 20 is secured to the heatsink plate 10 by fixing the two fixtures 22 into the two holes 16 of the heatsink plate 10, hereby avoiding the heatsink plate 10 from oppressing in the VGA 110 directly, which may warp and/or damage the VGA 110.

Referring to FIG. 3 again, as assembled, the heat that the VGA 110 generated in operation, can be absorbed by the sliding block 40 and passed to the two heat dissipation tubes 30. As shown in FIG. 4, one end of the two heat dissipation tubes 30 is closed to the VGA 110, the heat absorbed by the sliding block 40 from the VGA 110 will pass to the other end, since the two heat dissipation tubes 30 is formed with a fiber and heat conduction medium. The heat conduction medium is cooling and comeback to original place repeatedly, when heat pass to far end of the VGA 110. The heat generated by the VGA 110 has been carry out effectively, or the heat absorbed by the two heat dissipation tubes 30 can be carried to a heatsink fan for heat dissipation. In addition, as shown in FIGS. 2 and, the chipset heatsink pedestal 14 is connected with the chipset 120 of the motherboard 100 and adhered on the heat dissipation flat-top 122 of the chipset 120, so that the heat of chipset can be dissipated by the chipset heatsink pedestal 14. Moreover, because the chip set 120 is not the main thermal source, the chipset heatsink pedestal 14 is enough for the chipset 120 to achieve the purpose of heat dissipation and cooling.

Figure 6:
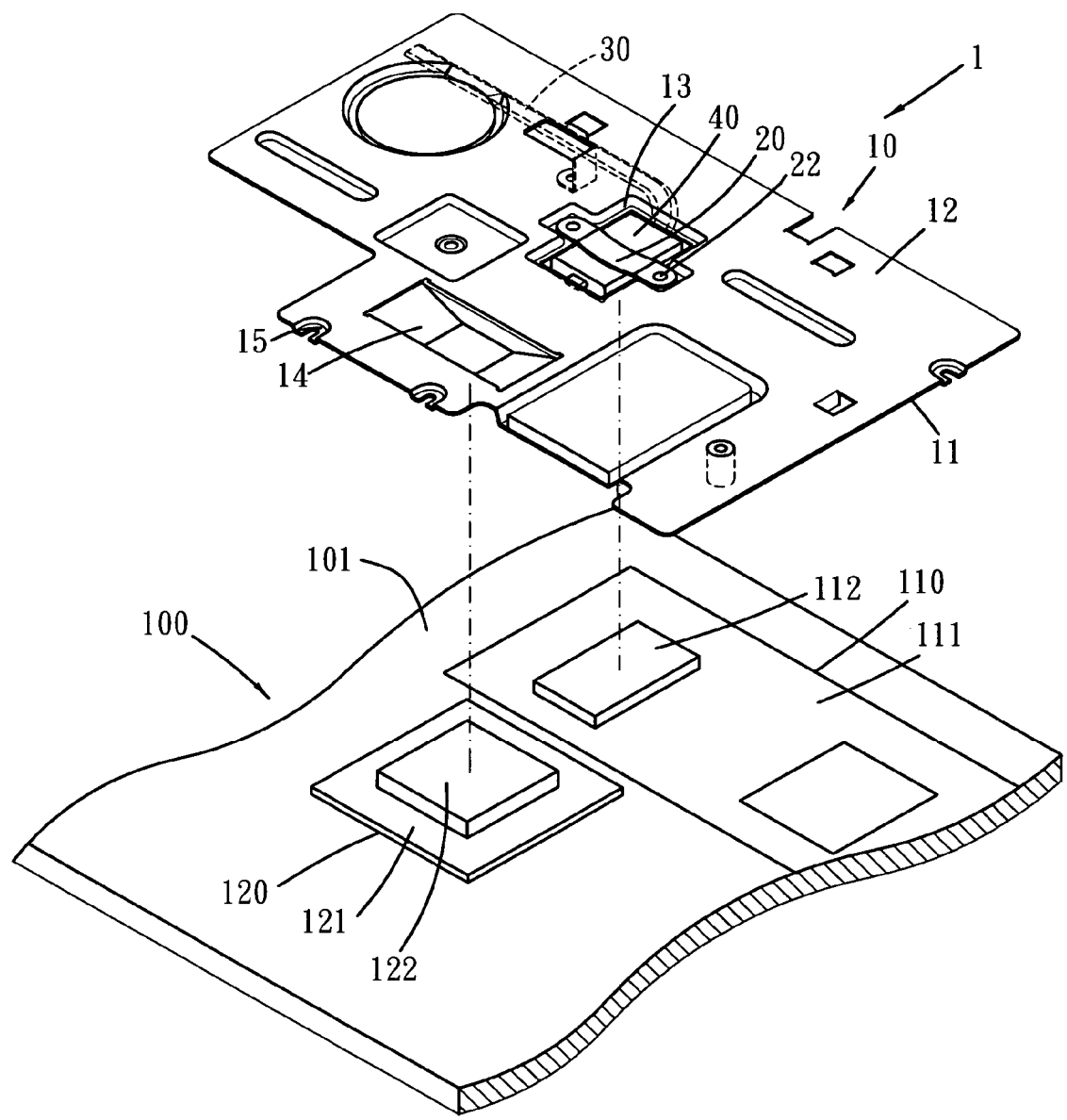
FIG. 6 is another 3D view of the present invention.

As shown in FIG. 6, the heatsink device of the present invention uses two pieces of heat dissipation tubes to help the heatsink for heat dissipation. It is understood that other numbers of the heat dissipation tubes can also be used to practice the present invention. Furthermore, at least one piece of heat dissipation tube can be collocated on the heatsink flat-top of a CPU, to help the CPU for heat dissipation and make the CPU working more effectively.

Additionally, a layer of insulator can be placed between the heatsink pad 50 and the sliding block 40 to isolate the electric conductivity between the heatsink pad 50 and the sliding block 40.

After the heatsink devices of the present invention have been fabricated, the heatsink plate is attached to the motherboard, the heatsink plate can be the crutch of keyboard in a notebook computer. It means that the keyboard can be set up at the heatsink plate and supported by the heatsink plate to achieve the goal of saving element and decreasing cost.

The heatsink plate of present invention is designed for heat dissipation for main thermal source such as the VGA and chipset. It can also be used in other applications. Therefore, the heatsink plate of present invention can have different designs. The heatsink can be designed to have different shapes and sizes and different heatsink pedestal designs corresponding to main thermal source of computer elements. According to the present invention, the heatsink can increase effect and save cost comparing to the prior art. In operation, the heatsink of the present invention can solve the heat problem of thermal sources of a computer in heatsink device. Besides, it does not occupy more space inside the computer for heatsink device, and it can provide higher function of heat dissipation to conquer the problems of heat dissipation.

The present invention, among other things, provides advantages of higher efficiency for the heat dissipation and reduction of cost.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A heatsink device for dissipating heat generated by thermal sources including a video graphics array and a chipset, comprising:
    a heatsink pad, contacting the video graphics array to conduct the heat from the video graphics array to the heatsink pad;
    a sliding block, stacked on the heatsink pad to conduct the heat from the heatsink pad to the sliding block;
    at least a heat dissipation tube, installed in the sliding block to conduct the heat from the sliding block to the heat dissipation tube; and
    a heatsink plate, having a video graphics array heatsink pedestal and a chipset heatsink pedestal, the video graphics array heatsink pedestal contacting the sliding block to dissipate the heat from the sliding block, and the chipset heatsink pedestal contacting the chipset to dissipate the heat from the chipset.

2. The heatsink device according to claim 1, wherein said heatsink plate is an integrated heatsink plate.

3. The heatsink device according to claim 1, wherein an insulator set on between said sliding block and said heatsink pad.

4. The heatsink device according to claim 1, further comprising an elasticity element, set up at the upper surface of the video graphics array heatsink pedestal to avoid the heatsink plate oppressing on the video graphics array directly.

5. The heatsink device according to claim 1, wherein said heatsink plate is stamped for a one-body forming.

6. The heatsink device according to claim 4, wherein said elasticity element is a leaf spring.

7. The heatsink device according to claim 1, wherein said sliding block is a rotatable and adjustable angle sliding block.

8. The heatsink device according to claim 5, wherein a lower surface of said video graphics array heatsink pedestal is formed by stamping.

9. The heatsink device according to claim 5, wherein a lower surface of said chipset heatsink pedestal is formed by stamping.

* * * * *